(12) United States Patent
Park

(10) Patent No.: US 11,908,825 B2
(45) Date of Patent: Feb. 20, 2024

(54) SEMICONDUCTOR DIE STACK HAVING BENT WIRES AND VERTICAL WIRES AND A SEMICONDUCTOR PACKAGE INCLUDING THE SEMICONDUCTOR DIE STACK

(71) Applicant: SK hynix Inc., Icheon-si (KR)

(72) Inventor: Jeong Hyun Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 197 days.

(21) Appl. No.: 17/497,368

(22) Filed: Oct. 8, 2021

(65) Prior Publication Data

US 2022/0392866 A1 Dec. 8, 2022

(30) Foreign Application Priority Data

Jun. 7, 2021 (KR) .................. 10-2021-0073742

(51) Int. Cl.
*H01L 23/00* (2006.01)
*H01L 25/065* (2023.01)

(52) U.S. Cl.
CPC .............. *H01L 24/49* (2013.01); *H01L 24/20* (2013.01); *H01L 24/48* (2013.01); *H01L 24/73* (2013.01);
(Continued)

(58) Field of Classification Search
CPC ......... H01L 24/49; H01L 24/20; H01L 24/48; H01L 24/73; H01L 25/0657; H01L 2224/2101; H01L 2224/48147; H01L 2224/49051; H01L 2224/49109; H01L 2224/49112; H01L 2224/4912; H01L 2224/73101; H01L 2225/06506; H01L 2225/06562; H01L 2924/301; H01L 24/19; H01L 23/585; H01L 24/05; H01L 24/45; H01L 25/18; H01L 2224/05554; H01L 2224/18; H01L 2224/45139; H01L 2224/45144; H01L 2224/48091; H01L 2224/48145; H01L 2225/0651; H01L 2225/06524; H01L 2225/06548; H01L 23/5386; H01L 23/552; H01L 24/46; H01L 24/02; H01L 2224/023; H01L 2224/46; H01L 2224/4809; H01L 2224/481

See application file for complete search history.

(56) References Cited

U.S. PATENT DOCUMENTS 8,853,863 B2 10/2014 Liao et al.
2006/0076690 A1* 4/2006 Khandros ............... H01L 24/49
257/777
2018/0211936 A1 7/2018 Chang et al.

* cited by examiner

*Primary Examiner* — Elias Ullah
(74) *Attorney, Agent, or Firm* — William Park & Associates Ltd.

(57) ABSTRACT

A semiconductor package includes a lower semiconductor die and an upper semiconductor die which are stacked with an offset in a first direction, wherein the lower semiconductor die includes a plurality of lower pads arranged in a second direction, which is perpendicular to the first direction, and wherein the upper semiconductor die includes a plurality of upper pads arranged in the second direction. The semiconductor package also includes bent wires electrically connecting the lower pads of the lower semiconductor die with the upper pads of the upper semiconductor die in the first direction. The semiconductor package further includes vertical wires such that a vertical wire is disposed on any one of the lower pad and the upper pad for each pair of pads electrically connected by a bent wire.

17 Claims, 21 Drawing Sheets

(52) U.S. Cl.
CPC .. *H01L 25/0657* (2013.01); *H01L 2224/2101* (2013.01); *H01L 2224/48147* (2013.01); *H01L 2224/4912* (2013.01); *H01L 2224/49051* (2013.01); *H01L 2224/49109* (2013.01); *H01L 2224/49112* (2013.01); *H01L 2224/73101* (2013.01); *H01L 2225/06506* (2013.01); *H01L 2225/06562* (2013.01); *H01L 2924/301* (2013.01)

SEMICONDUCTOR DIE STACK HAVING BENT WIRES AND VERTICAL WIRES AND A SEMICONDUCTOR PACKAGE INCLUDING THE SEMICONDUCTOR DIE STACK

CROSS-REFERENCE TO RELATED APPLICATIONS

The present application claims priority to Korean Patent Application No. 10-2021-0073742, filed on Jun. 7, 2021, which is herein incorporated by reference in its entirety.

BACKGROUND

1. Field

The present disclosure relates to a semiconductor die stack and a semiconductor package including the semiconductor die stack, and more specifically, to a semiconductor die stack having bent wires and vertical wires and a semiconductor package including the same.

2. Description of the Related Art

Fan-Out semiconductor packages including vertical wires have been suggested to electrically connect a stacked semiconductor die stack to a redistribution layer.

SUMMARY

Some embodiments of the present disclosure are directed to a semiconductor die stack including bent wires and vertical wires and a Fan-Out semiconductor package.

Some embodiments of the present disclosure are directed to a semiconductor die stack with reduced electrical interference among vertical wires and a Fan-Out semiconductor package.

According to an embodiment of the present disclosure, a semiconductor package may include: a lower semiconductor die and an upper semiconductor die which are stacked in a staircase form in a first direction, wherein the lower semiconductor die includes a plurality of lower pads arranged in a second direction, which is perpendicular to the first direction, and the upper semiconductor die includes a plurality of upper pads arranged in the second direction. The semiconductor package may also include bent wires electrically connecting at least one of the lower pads of the lower semiconductor die to at least one of the upper pads of the upper semiconductor die in pairs in the first direction. The semiconductor package may further include vertical wires disposed on any ones of the lower pads and the upper pads which are electrically connected by the bent wires.

According to an embodiment of the present disclosure, a semiconductor package may include a semiconductor die stack, the semiconductor die stack including: a lower semiconductor die including first and second lower pads, and an upper semiconductor die including first and second upper pads stacked on the lower semiconductor die; a first bent wire electrically connecting a first lower pad with a first upper pad in a first direction; a second bent wire electrically connecting a second lower pad with a second upper pad in the first direction; a first vertical wire disposed on any one of the first lower pad and the first upper pad; and a second vertical wire disposed on any one of the second lower pad and the second upper pad.

According to an embodiment of the present disclosure, a semiconductor package may include a semiconductor die stack, the semiconductor die stack including a lower semiconductor die and an upper semiconductor die which are stacked in a staircase form in a first direction, wherein the lower semiconductor die includes a plurality of lower pads arranged in a second direction, the second direction being perpendicular to the first direction, and wherein the upper semiconductor die includes a plurality of upper pads arranged in the second direction. The semiconductor die stack also includes: bent wires electrically connecting at least one of the lower pads of the lower semiconductor die to at least one of the upper pads of the upper semiconductor die in the first direction; and vertical wires disposed on one of the lower pads for at least every other pair of pads which are electrically connected by the bent wires in the first direction.

According to some embodiments of the present disclosure, electrical signal interference among vertical wires may be reduced because the vertical wires are disposed to be spaced apart from each other.

DETAILED DESCRIPTION

Figure 1A:
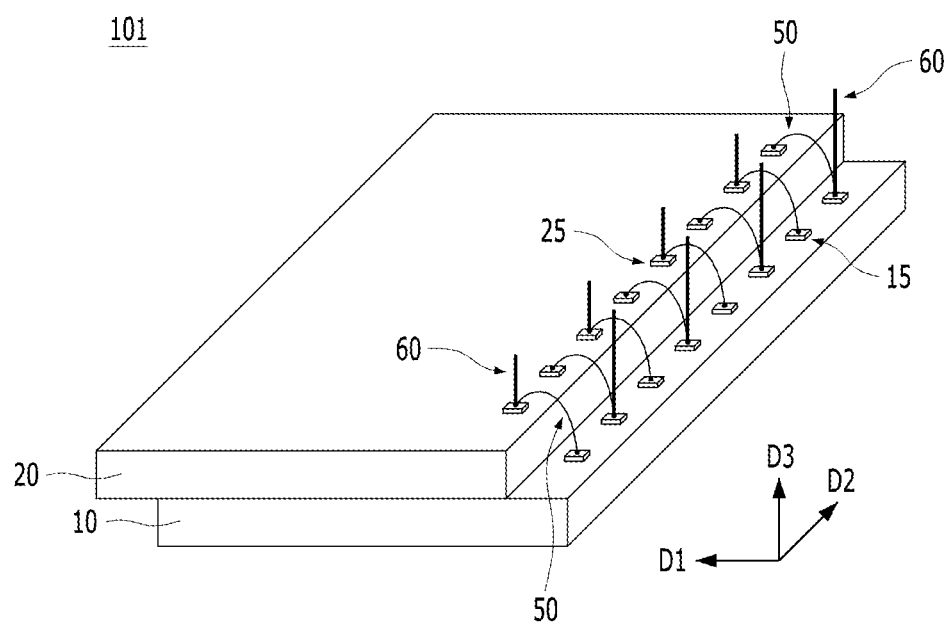
FIGS. 1A to 1C are perspective, top, and partially enlarged views, respectively, illustrating a semiconductor die stack according to an embodiment of the present disclosure.

Various embodiments of the present disclosure will be described below in more detail with reference to the accompanying drawings. The drawings are not necessarily to scale and in some instances, proportions may have been exaggerated in order to clearly illustrate features of the embodiments. When a multi-layer structure having two or more layers is disclosed in the drawings or detailed description, the relative positional relationship or arrangement order of the layers as shown only reflects a specific embodiment, and thus the present disclosure is not limited thereto. The present disclosure may include different relative positional relationships or arrangement orders from the illustrated embodiments. Furthermore, the drawings or detailed description of a multi-layer structure may not reflect all layers present in a particular multi-layer structure (e.g., one or more additional layers may be present between the two layers shown). For example, when the multilayer structure is illustrated to include a first layer on a second layer or a substrate in the drawings or detailed description, it not only refers to a case where the first layer is formed directly on the second layer or directly on the substrate, but also a case where one or more other layers are present between the first layer and the second layer or between the first layer and the substrate.

Figure 1B:
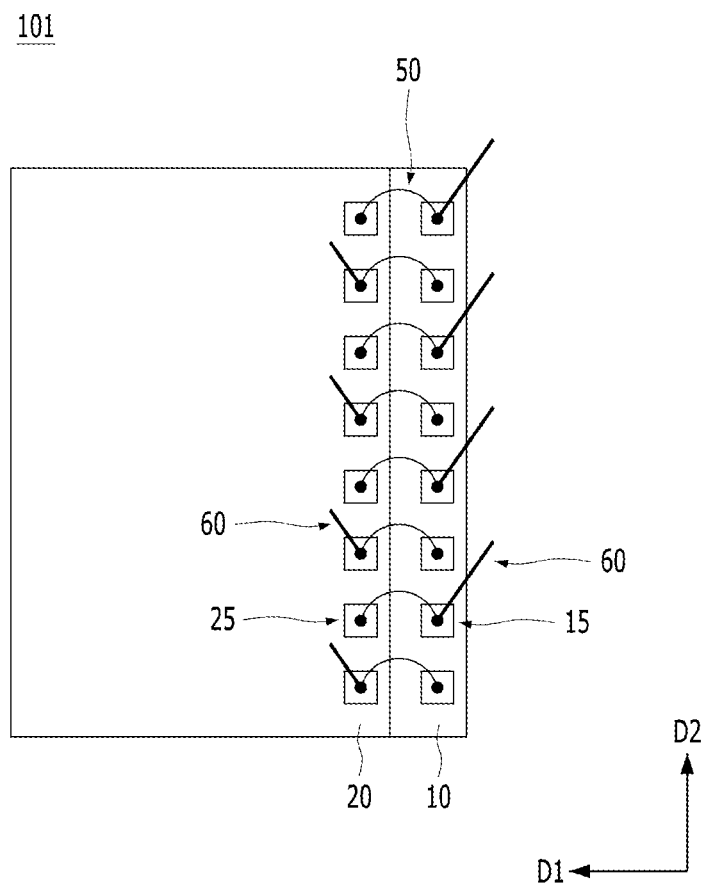
Figure 1C:
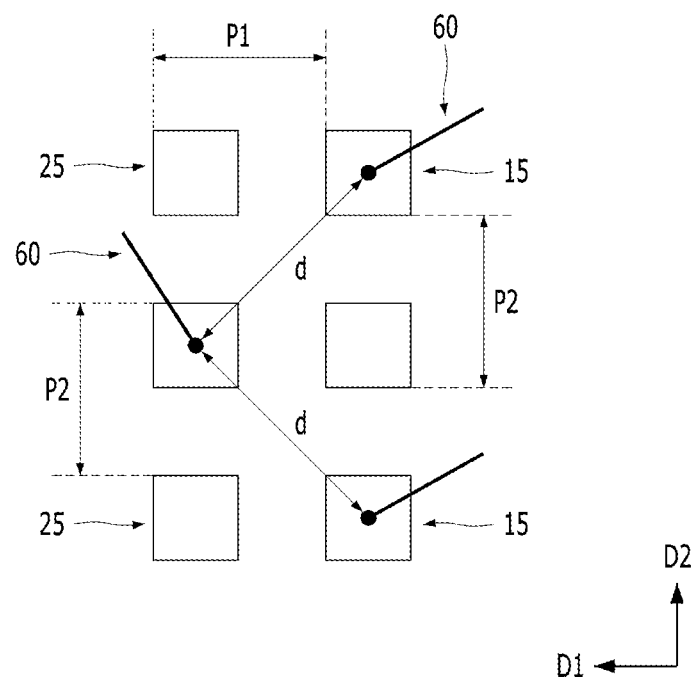

FIGS. 1A to 1C are perspective, top, and partially enlarged views, respectively, illustrating a semiconductor die stack 101 according to an embodiment of the present disclosure.

Referring to FIGS. 1A and 1B, the semiconductor die stack 101 according to an embodiment of the present disclosure may include a lower semiconductor die 10, an upper semiconductor die 20, bent wires 50, and vertical wires 60.

The lower semiconductor die 10 and the upper semiconductor die 20 may be stacked in a staircase form or staggered in the first direction D1. The lower semiconductor die 10 may include a plurality of lower pads 15 arranged on a straight line parallel to a second direction D2, and the upper semiconductor die 20 may include a plurality of upper pads 25 arranged on a straight line parallel to the second direction D2.

The lower pads 15 and the upper pads 25 may be disposed on straight lines parallel to the second direction D2, respectively. The lower pads 15 and the upper pads 25 may be disposed in a region closer to an edge of the lower semiconductor die 10 and the upper semiconductor die 20, respectively. The lower pads 15 and the upper pads 25 may protrude from surfaces of the lower semiconductor die 10 and the upper semiconductor die 20, respectively. In an embodiment, the lower pads 15 and the upper pads 25 may be disposed in recesses below the surfaces of the lower semiconductor die 10 and the upper semiconductor die 20, respectively. The lower pads 15 and the upper pads 25 may include metal.

The bent wires 50 may electrically connect the lower pads 15 of the lower semiconductor die 10 with the upper pads 25 of the upper semiconductor die 20 which are adjacently disposed along the first direction D1 in a cascade form.

The vertical wires 60 may be disposed on some of the lower pads 15 and/or the upper pads 25 to stand up vertically straight in the third direction D3. Each vertical wire 60 may selectively be disposed on either of the lower pad 15 and the upper pad 25 which are connected by a respective bent wire 50. The vertical wires 60 may be arranged in a zigzag shape or pattern in the second direction D2. That is, the vertical wires 60 may be disposed to alternate the lower pads 15 and the upper pads 25 in the second direction D2. The vertical wires 60 may be disposed on every other pad of the lower pads 15 or the upper pads 25. The bent wires 50 and the vertical wires 60 may be bonding wires including gold (Au) or silver (Ag).

The lower semiconductor die 10 and the upper semiconductor die 20 may include semiconductor memory devices. For example, the lower semiconductor die 10 and the upper semiconductor die 20 may each include one of memory devices such as DRAM, SRAM, ReRAM, MRAM, PcRAM, NVM, or NAND Flash. In an embodiment, the lower semiconductor die 10 and the upper semiconductor die 20 may be the same type of semiconductor memory device. Accordingly, it is assumed that the arrangements of the lower pads 15 of the lower semiconductor die 10 and the upper pads 25 of the upper semiconductor die 20 are the same state. In another embodiment, any one of the lower semiconductor die 10 and the upper semiconductor die 20 may be a logic semiconductor device including a microprocessor.

Referring to FIG. 1C, each lower pad 15 and each upper pad 25 may be spaced apart from each other by a first pitch P1 along the first direction D1. The lower pads 15 may be spaced apart from each other by a second pitch P2 in the second direction D2. The upper pads 25 may be spaced apart from each other by the second pitch P2 in the second direction D2. The vertical wires 60 may be spaced apart and disposed in a diagonal direction with respect to the first direction D1 and the second direction D2. Accordingly, the separation distance d between the vertical wires 60 may be greater than the first pitch P1 and the second pitch P2. In an embodiment, the separation distance d, the first pitch P1, and the second pitch P2 may be described by the following equation.

$$d^2 = P1^2 + P2^2$$

Figure 1D:
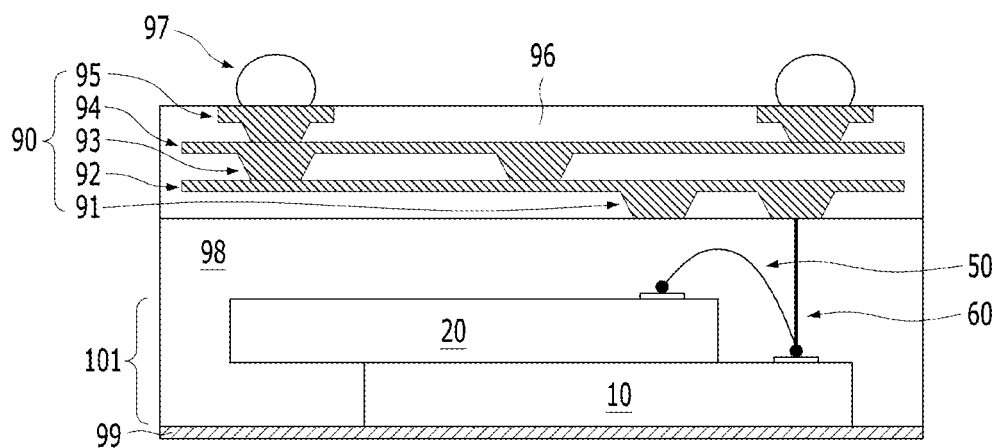
FIG. 1D is a side view illustrating a semiconductor package including a semiconductor die stack according to an embodiment of the present disclosure.

FIG. 1D is a side view illustrating a semiconductor package 201 including a semiconductor die stack 101 according to an embodiment of the present disclosure.

Referring to FIG. 1D, the semiconductor package 201 may include the semiconductor die stack 101 and a redistribution layer 90. The semiconductor package 201 may further include a molding material 98 surrounding the semiconductor die stack 101. The semiconductor package 201 may further include a support substrate 99 for supporting the semiconductor die stack 101. The semiconductor package 201 may further include bumps 97 disposed on the redistribution layer 90.

The redistribution layer 90 may include a lower via 91, a lower interconnection layer 92, an upper via 93, an upper interconnection layer 94, a bump pad 95, and an insulating layer 96.

The lower via 91 may be electrically connected by directly contacting the vertical wire 60. The lower interconnection layer 92 and the upper interconnection layer 94 may extend in a lateral direction to transmit electrical signals in the lateral direction. The upper via 93 may electrically connect the lower interconnection layer 92 with the upper interconnection layer 94. The bump pad 95 may electrically connect the upper interconnection layer 94 with the bump 97 in a vertical direction. The lower via 91, the lower interconnection layer 92, the upper via 93, and the upper interconnection layer 94 may include a metal such as copper (Cu), aluminum (Al), tungsten (W), or titanium (Ti). The bump pad 95 may include a metal such as copper (Cu), aluminum (Al), tungsten (W), titanium (Ti), nickel (Ni), or tin (Sn). The insulating layer 96 may cover the lower via 91, the lower interconnection layer 92, the upper via 93, the upper interconnection layer 94, and the bump pad 95. The insulating layer 96 may include silicon oxide, silicon nitride, or other insulating materials.

The redistribution layer 90 might not include a lower pad. The lower pad may be formed by a photolithography process and a plating process to have vertical sidewalls by using copper or the like. In contrast, the lower via 91 may be formed to have inclined sidewalls by an etching process or the like, unlike the lower pad. Accordingly, the lower vias 91 should be formed to have a wider gap and a larger pitch than the lower pads.

When the vertical wires 60 are disposed on all the lower pads 15 and the upper pads 25, the lower pads 15 are absolutely necessary because the distance between the vertical wires 60 is small. However, in the present embodiment, because the vertical wires 60 are disposed in a diagonal direction, the gap between the vertical wires 60 is sufficiently large. Therefore, an electrical connection between the redistribution layer 90 and the vertical wires 60 may be achieved only by the lower vias 91 without a lower pad. That is, at least one photolithography process and an etching process may be skipped.

The bumps 97 may be disposed on the bump pads 95 of the redistribution layer 90. The bumps 97 may include solder balls or metal bumps. The molding material 98 may include an epoxy molding compound. The molding material 98 may cover the lower semiconductor die 10, the upper semiconductor die 20, the bent wires 50, and the vertical wires 60. The support substrate 99 may include glass, plastic, ceramic, silicon, graphene, or metal. The support substrate 99 may be disposed under the lower surface of the lower semiconductor die 10.

Figure 2A:
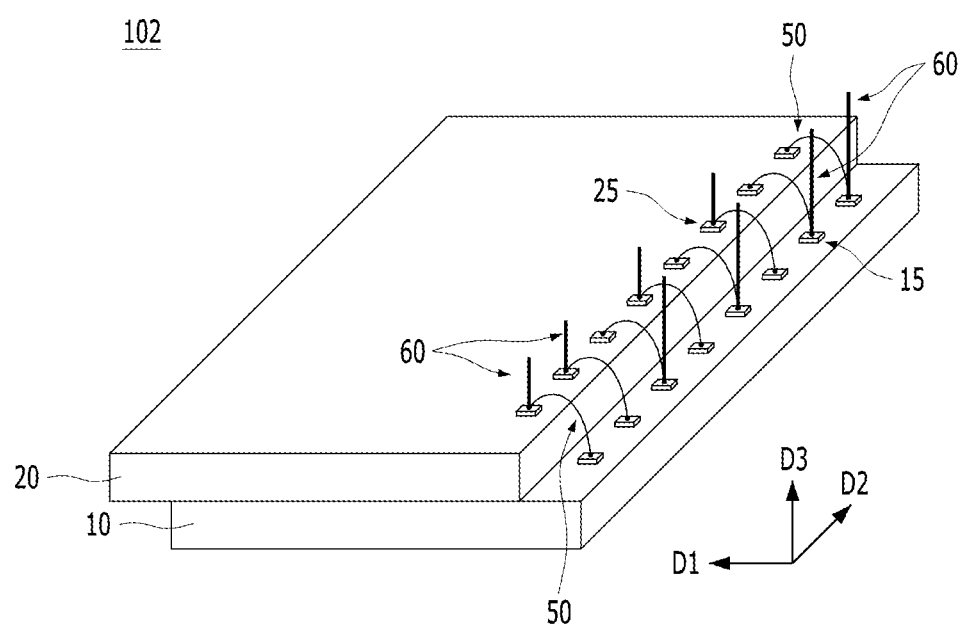
FIGS. 2A and 2B are perspective views illustrating semiconductor die stacks according to embodiments of the present disclosure.
Figure 2B:
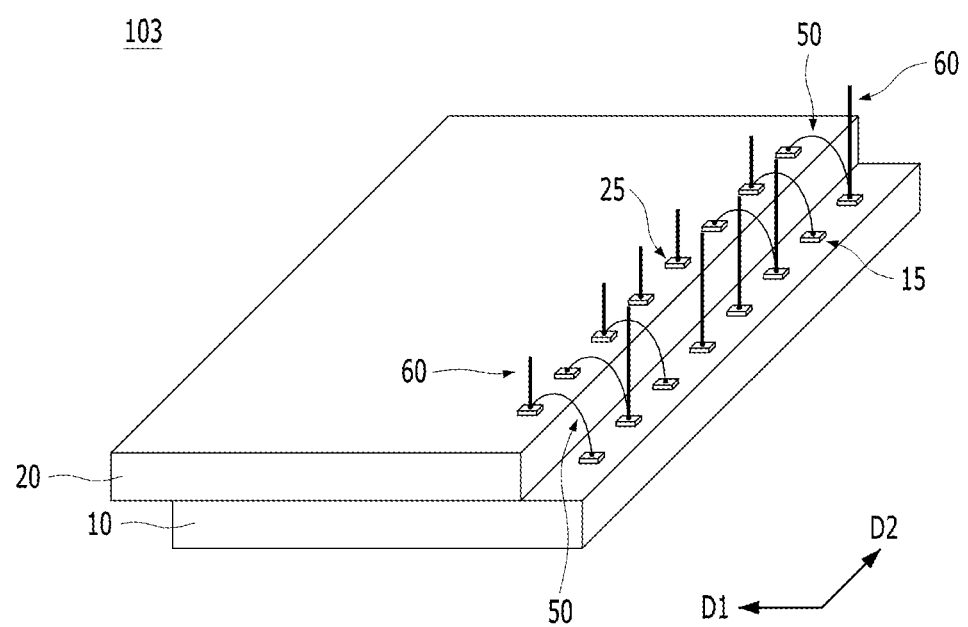

FIGS. 2A and 2B are perspective views illustrating semiconductor die stacks 102 and 103 in accordance with embodiments of the present disclosure. Referring to FIGS. 2A and 2B, the semiconductor die stacks 102 and 103 may include a lower semiconductor die 10 and an upper semiconductor die 20 which are stacked in a staircase form with a horizontal offset, bent wires 50, and vertical wires 60. The lower semiconductor die 10 may include lower pads 15 arranged on a straight line in the second direction D2 on a surface region close to an edge of the lower semiconductor die 10. The upper semiconductor die 20 may include upper pads 25 arranged on a straight line in the second direction D2 on a surface region close to an edge of the upper semiconductor die 20. The bent wires 50 may connect the lower pads 15 with the upper pads 25 in the first direction D1 in a cascade form. The vertical wires 60 may be selectively disposed on any one of the lower pads 15 and the upper pads 25 which are electrically connected by the bent wires 50.

Referring to FIG. 2A, some of the vertical wires 60 may be disposed adjacent to each other along the second direction D2. Specifically, some of the vertical wires 60 may be disposed on either the lower pads 15 adjacent to each other or the upper pads 25 adjacent to each other in the second direction D2. For example, adjacent vertical wires 60 may transmit power or a DC signal. Because the power or DC signal are less affected by the interference or coupling, the vertical wires 60, the lower pads 15, and the upper pads 25 that transmit the power or DC signal may be disposed adjacent to each other, respectively. The vertical wires 60, the lower pads 15, and the upper pads 25 that transmit pulse form or alternating signals such as a clock signal, a command signal, an address signal, and the like, may be disposed to be spaced apart.

Referring to FIG. 2B, some of the bent wires 50 may be removed or omitted. For example, some of the lower pads 15 and the upper pads 25 adjacent in the first direction D1 might not be electrically connected. The lower pads 15 and the upper pads 25 that independently transmit electrical signals to the lower semiconductor die 10 or the upper semiconductor die 20 might not be connected to each other. The vertical wires 60 may be respectively disposed on the lower pads 15 and the upper pads 25 that are not connected to each other.

The technical features described with reference to FIGS. 2A and 2B may be combined. For example, some of the vertical wires 60 may be disposed adjacent to each other, and some of the bent wires 50 may be omitted.

Figure 3A:
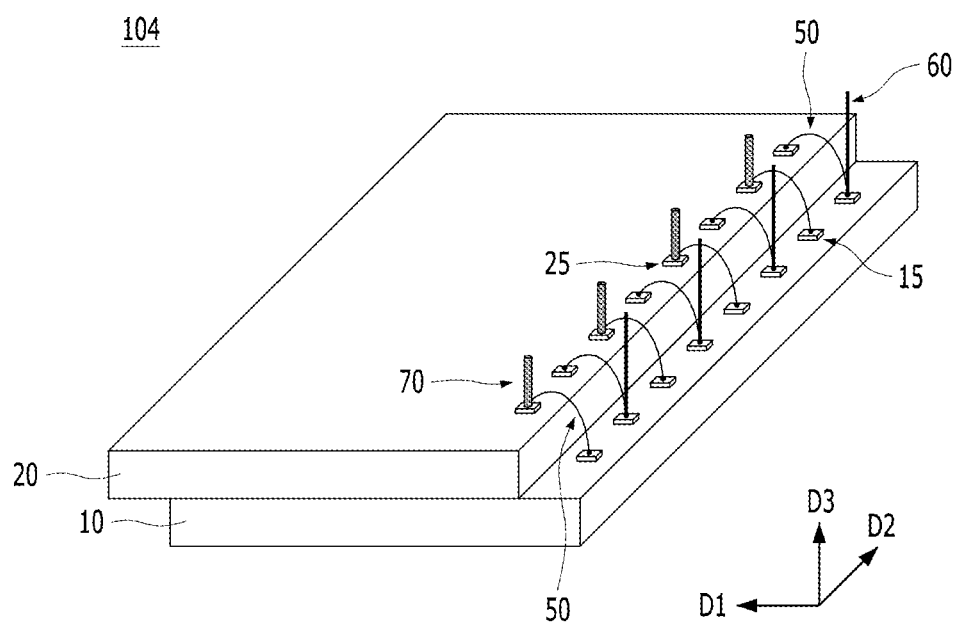
FIG. 3A is a perspective view illustrating a semiconductor die stack according to an embodiment of the present disclosure.

FIG. 3A is a perspective view illustrating a semiconductor die stack 104 according to an embodiment of the present disclosure. Referring to FIG. 3A, the semiconductor die stack 104 may include a lower semiconductor die 10, an upper semiconductor die 20, bent wires 50, vertical wires 60, and metal pillars 70. The vertical wires 60 may be disposed on the lower pads 15 of the lower semiconductor die 10. The metal pillars 70 may be disposed on the upper pads 25 of the upper semiconductor die 20. The vertical wires 60 disposed on the upper pads 25 of the upper semiconductor die 20 of the semiconductor die stack 101 shown in FIG. 1A may be replaced with the metal pillars 70. The metal pillars 70 may be disposed on every other pad of the upper pads 25. The vertical wires 60 may be disposed on every other pad of the lower pads 15. Accordingly, the metal pillars 70 and the lower pads 15 may be disposed in a zigzag shape or pattern in the second direction D2. Alternatively, the metal pillars 70 and vertical wires 60 may be exclusively disposed alternately on the upper pads 25 and the lower pads 15 in the second direction D2. That is, the metal pillars 70 and the vertical wires 60 might not be electrically connected through the bent wires 50. The metal pillars 70 may include a metal such as copper (Cu). Each of the vertical wires 60 is formed and disposed by an individual process, but a plurality of metal pillars 70 may be simultaneously disposed by one process. That is, the metal pillars 70 may provide higher throughput or bandwidth than the vertical wires 60. Components and technical features not described may be understood with reference to other drawings.

Figure 3B:
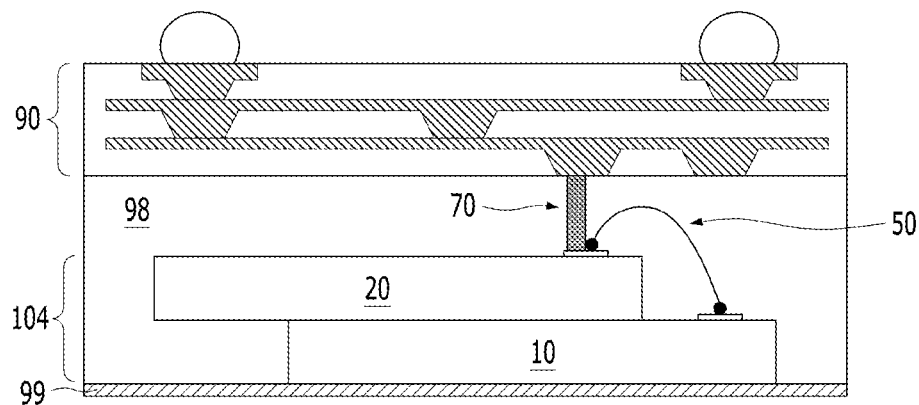
FIG. 3B is a side view illustrating a semiconductor package including a semiconductor die stack according to an embodiment of the present disclosure.

FIG. 3B is a side view illustrating a semiconductor package 202 including a semiconductor die stack 104 in accordance with an embodiment of the present disclosure. Referring to FIG. 3B, the semiconductor package 202 may further include a metal pillar 70 disposed on the upper pad 25 of the upper semiconductor die 20 compared to FIG. 1D. The metal pillar 70 may electrically connect the upper pad 25 of the upper semiconductor die 20 and the lower via 91 of the redistribution layer 90.

In addition, the features of the present disclosure described with reference to FIGS. 2A and 2B may be combined with the semiconductor die stack 104 and the semiconductor package 202 of FIGS. 3A and 3B. That is, some of the metal pillars 70 or the vertical wires 60 may be disposed adjacent to each other in the second direction D2, and some of the bent wires 50 may be omitted.

Figure 4A:
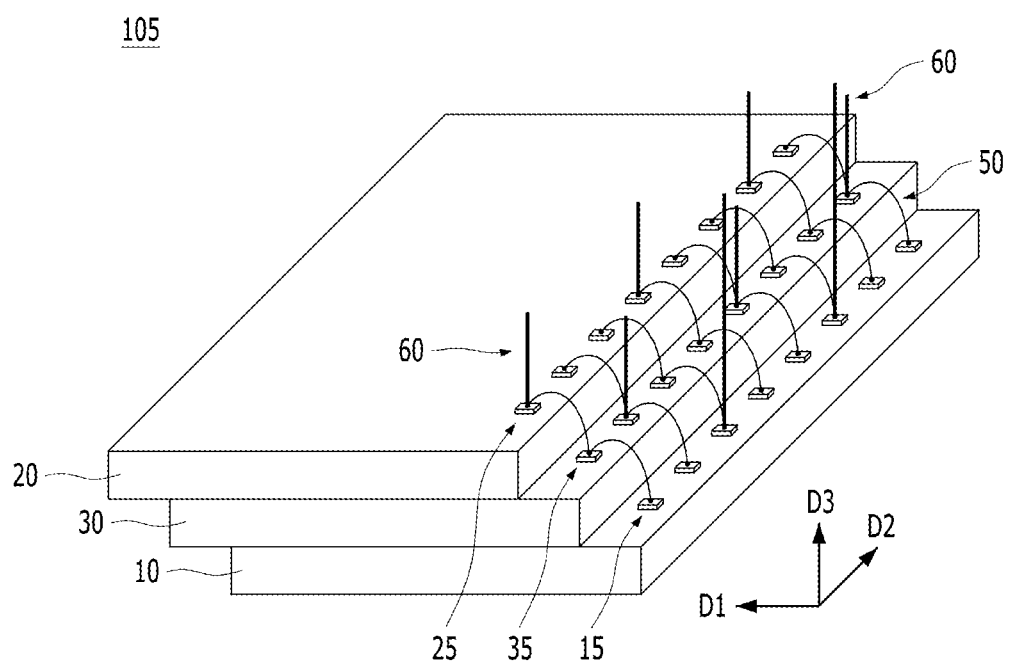
FIGS. 4A and 4B are perspective and top views, respectively, illustrating a semiconductor die stack according to an embodiment of the present disclosure.
Figure 4B:
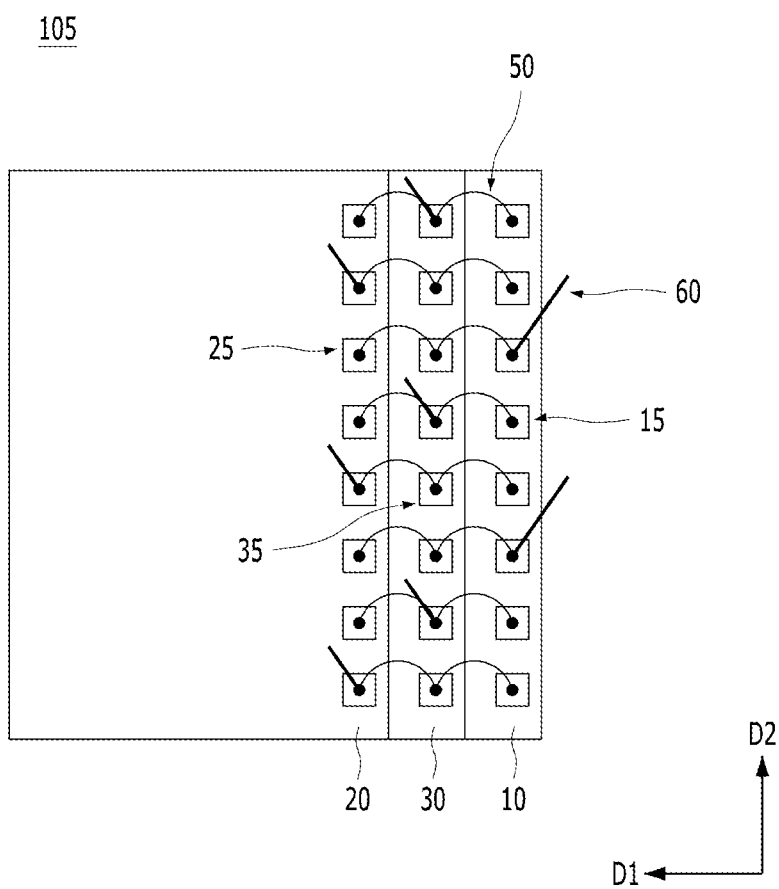

FIGS. 4A and 4B are perspective and top views illustrating a semiconductor die stack 105 according to an embodiment of the present disclosure. Referring to FIGS. 4A and 4B, the semiconductor die stack 105 may include a lower semiconductor die 10, an intermediate semiconductor die 30, an upper semiconductor die 20, bent wires, 50, and vertical wires 60. The lower semiconductor die 10, the intermediate semiconductor die 30, and the upper semiconductor die 20 may be stacked in a staircase form or tiered in the first direction D1. The lower semiconductor die 10 may include lower pads 15 arranged on a straight line parallel to the second direction D2. The intermediate semiconductor die 30 may include intermediate pads 35 arranged on a straight line parallel to the second direction D2. The upper semiconductor die 20 may include upper pads 25 arranged on a straight line in the second direction D2. The bent wires 50 may electrically connect the lower pads 15, the intermediate pads 35, and the upper pads 25 aligned in the first direction D1 in a cascade form. The vertical wires 60 may be selectively disposed on any one of the lower, intermediate, and upper pads 15, 35, and 25 which are connected in the cascade form. The vertical wires 60 may be disposed not to be adjacent to each other in the first direction D1 and the second direction D2. For example, the vertical wires 60 may be arranged to be aligned in a diagonal direction. In an embodiment, the vertical wires 60 may be randomly arranged.

Figure 5A:
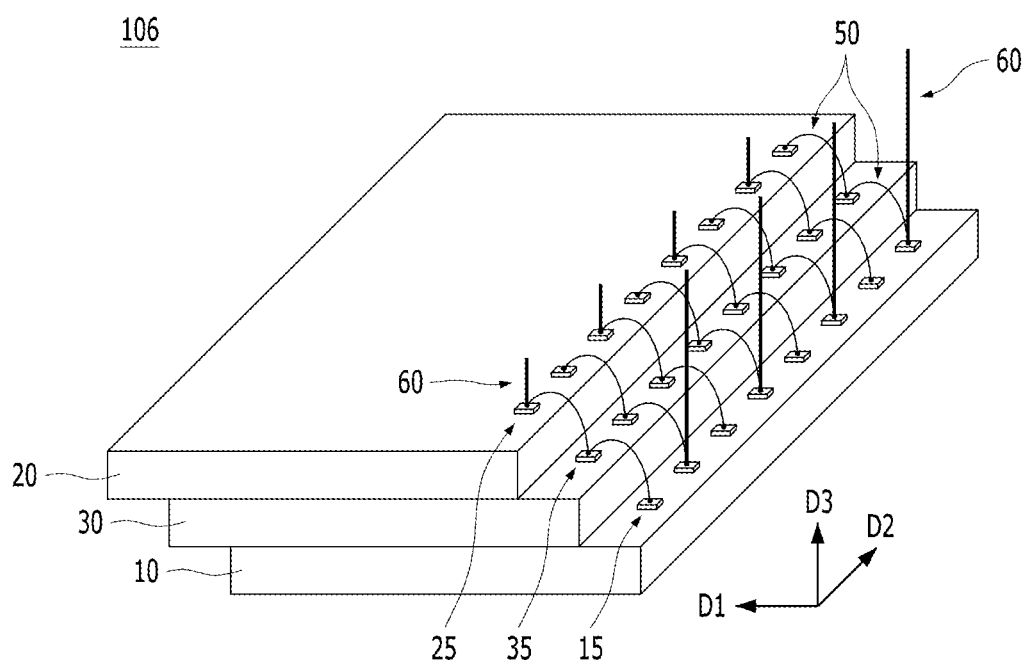
FIGS. 5A and 5B are perspective and top views, respectively, illustrating a semiconductor die stack according to an embodiment of the present disclosure.
Figure 5B:
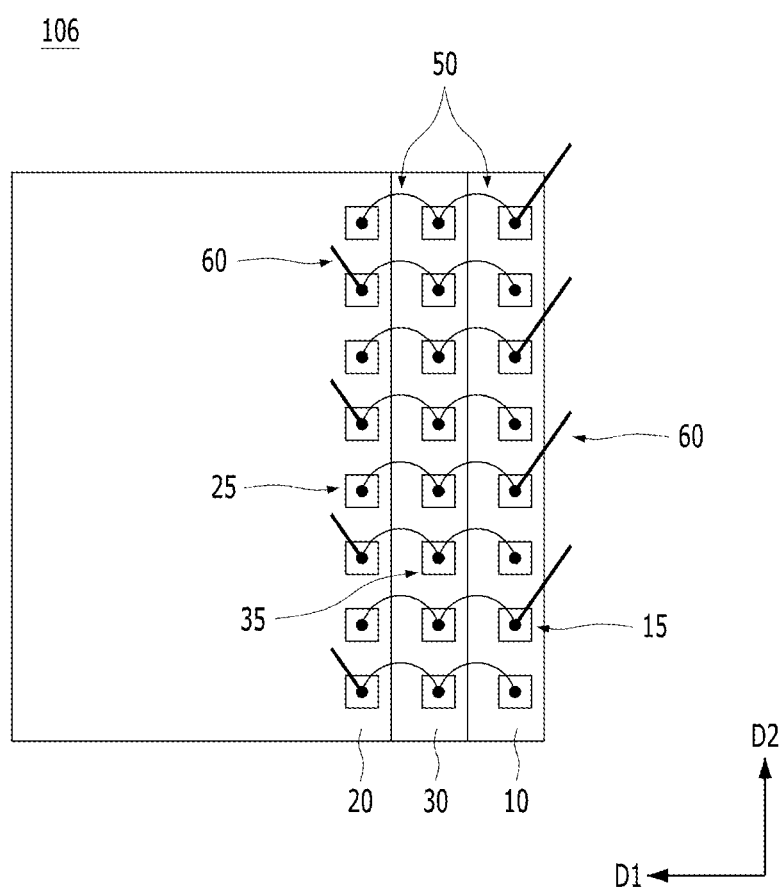

FIGS. 5A and 5B are perspective and top views illustrating a semiconductor die stack 106 according to an embodiment of the present disclosure. Referring to FIGS. 5A and 5B, the semiconductor die stack 106 may include a lower semiconductor die 10, an intermediate semiconductor die 30, and an upper semiconductor die 20, bent wires 50, and vertical wires 60. The lower die 10, the intermediate die 30, and the upper semiconductor die 20 may be stacked in a staircase form in the first direction D1. The lower die 10, the intermediate die 30, and the upper semiconductor die 20 may include lower pads 15, intermediate pads 35, and upper pads 25, respectively. The lower pads 15, the intermediate pads 35, and the upper pads 25 may be respectively arranged on straight lines parallel to the second direction D2. The bent wires 50 may electrically connect the lower pads 15, the intermediate pads 35, and the upper pads 25 aligned in the first direction D1 in a cascade form. The vertical wires 60 may be selectively disposed on either the lower pad 15 or the upper pad 25 among the lower pads 15, the intermediate pads 35, and the upper pads 25 which are connected in a cascade form. For example, the vertical wire 60 might not be disposed on the intermediate pad 35 of the intermediate semiconductor die 30. Compared to the semiconductor die stack 105 of FIGS. 4A and 4B, the separation distance between the vertical wires 60 may be greater. Accordingly, the signal interference and coupling between the vertical wires 60 may be reduced. In another embodiment, the vertical wires 60 may be selectively disposed on either the intermediate pad 35 or the upper pad 25 among the lower pads 15, the intermediate pads 35, and the upper pads 25 which are connected in a cascade form. For example, the vertical wires 60 might not be disposed on the lower pads 15 of the lower semiconductor die 10. In another embodiment, the vertical wires 60 may be selectively disposed on the lower pads 15 and the intermediate pads 35 among the lower pads 15, the intermediate pads 35, and the upper pads 25 which are connected in a cascade form. For example, the vertical wires 60 might not be disposed on the upper pads 25 of the upper semiconductor die 20.

Figure 6A:
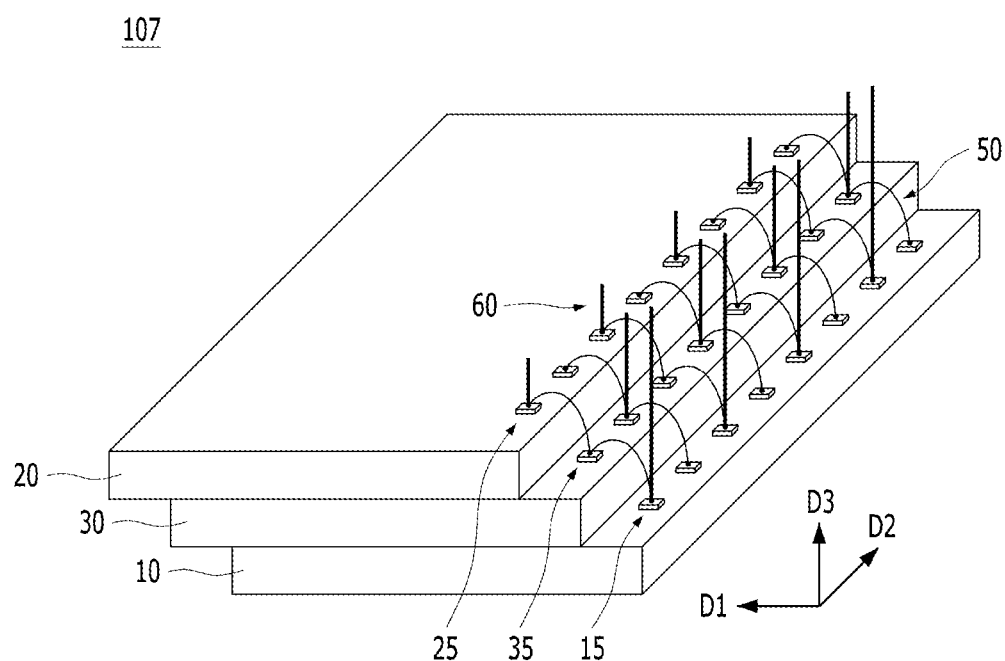
FIGS. 6A and 6B are perspective and top views, respectively, illustrating a semiconductor die stack according to an embodiment of the present disclosure.
Figure 6B:
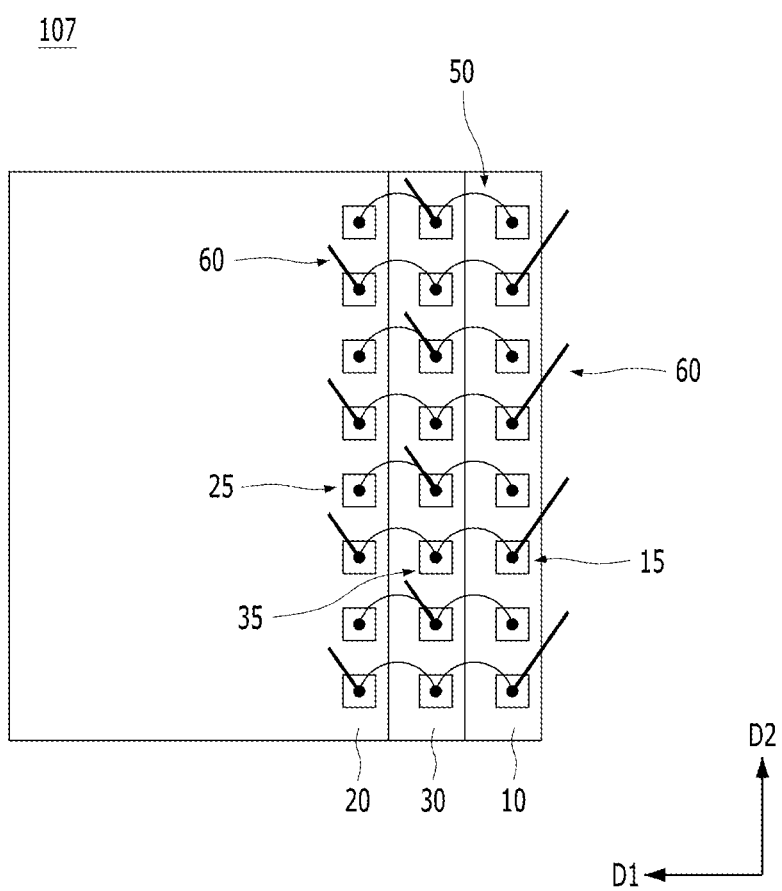

FIGS. 6A and 6B are perspective and top views illustrating a semiconductor die stack 107 according to an embodiment of the present disclosure. Referring to FIGS. 6A and 6B, the vertical wires 60 may be selectively disposed on two of the lower pads 15, the intermediate pads 35, and the upper pads 25 in the semiconductor die stack 107 according to an embodiment of the present disclosure which are connected in a cascade form when compared with the semiconductor die stack 106 illustrated in FIGS. 5A and 5B. For example, a vertical wire 60 may be disposed on both a lower pad 15 of the lower semiconductor die 10 and a corresponding upper pad 25 of the upper semiconductor die 20. The vertical wires 60 may be arranged in a zigzag shape or pattern. For example, the vertical wires 60 may be arranged in a diagonal direction, as shown in FIGS. 6A and 6B.

Figure 7A:
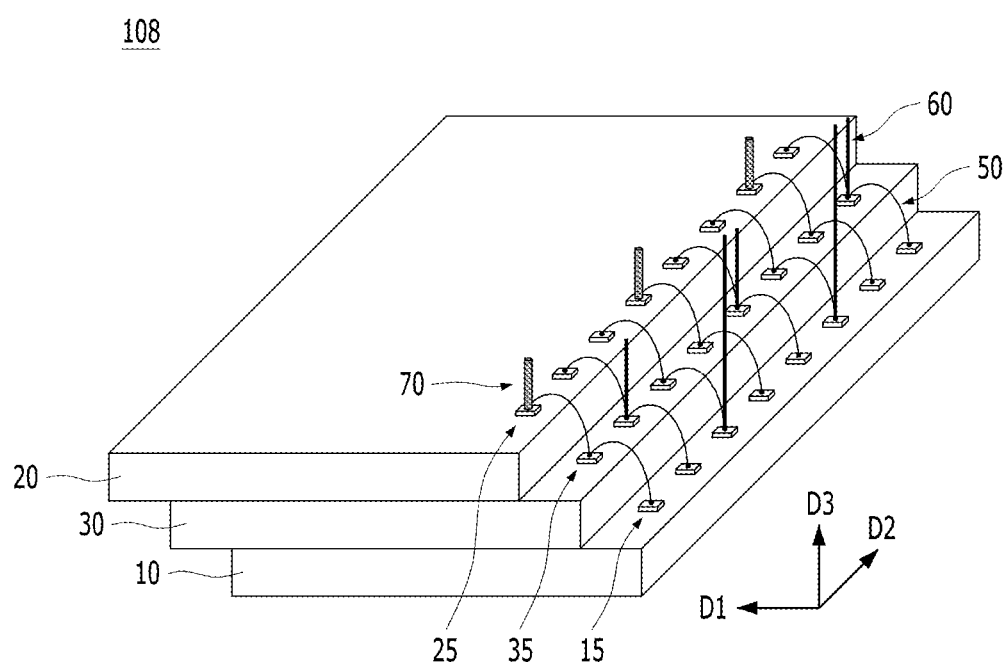
FIGS. 7A to 7C are perspective views illustrating semiconductor die stacks according to embodiments of the present disclosure.
Figure 7B:
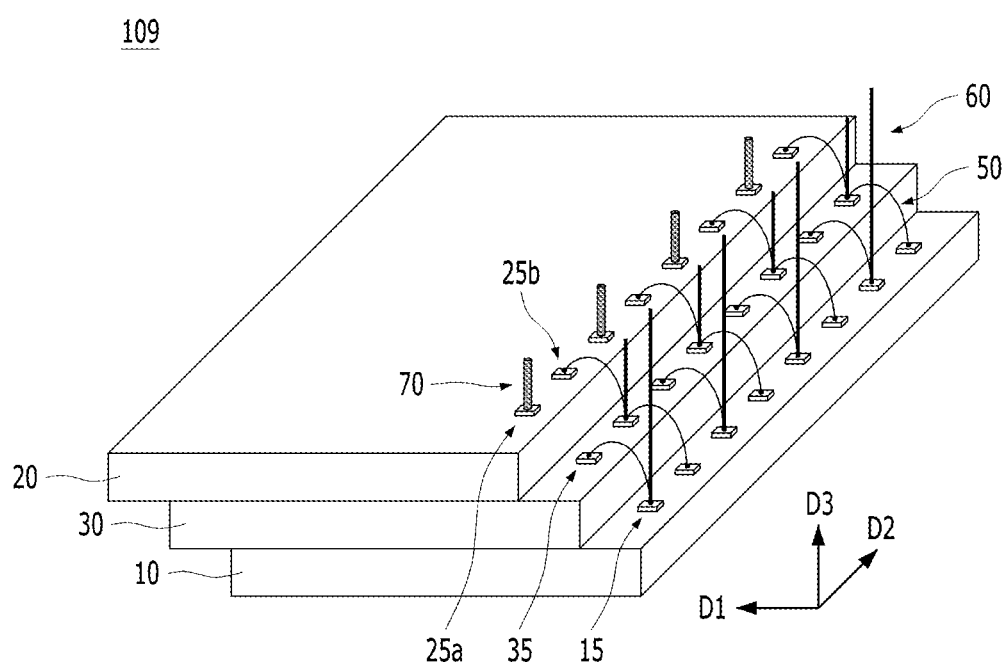
Figure 7C:
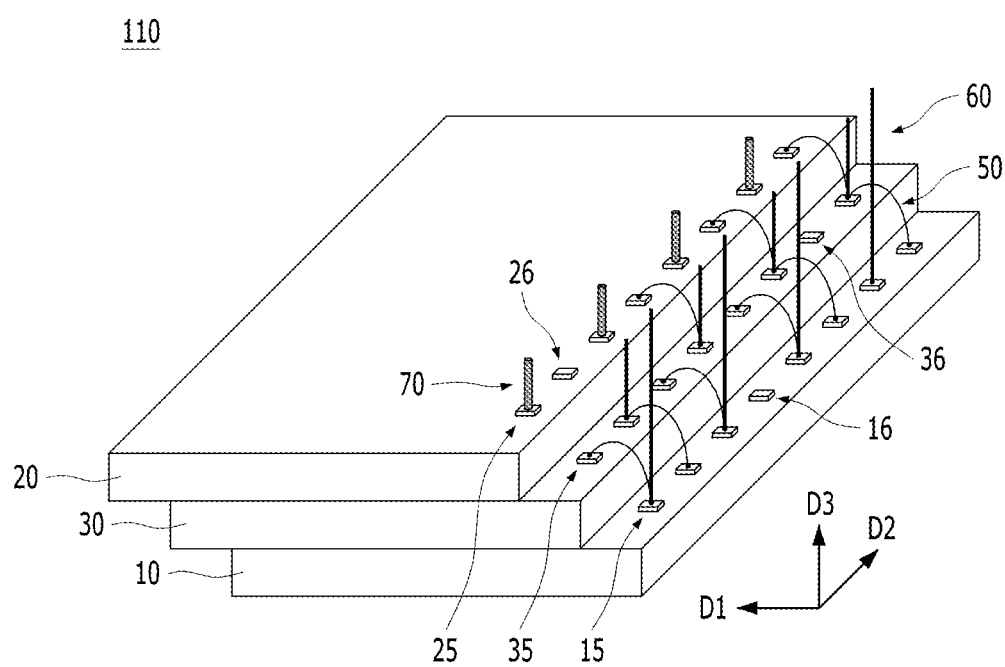

FIGS. 7A to 7C are perspective views illustrating semiconductor die stacks 108 to 110 according to embodiments of the present disclosure. Referring to FIG. 7A, the semiconductor die stack 108 may include a lower semiconductor die 10, an intermediate semiconductor die 30, an upper semiconductor die 20, bent wires 50, vertical wires 60, and metal pillars 70. The lower die 10, the intermediate die 30, and the upper semiconductor die 20 may be stacked in a staircase form in the first direction D1. The vertical wires 60 may be selectively disposed on the lower pads 15 of the lower semiconductor die 10 and the intermediate pads 35 of the intermediate semiconductor die 30. The metal pillars 70 may be selectively disposed on the upper pads 25 of the upper semiconductor die 20. The metal pillars 70 and the vertical wires 60 might not be electrically connected. That is, either the vertical wires 60 or the metal pillars 70 may be selectively disposed on any one of corresponding upper pads 25, corresponding intermediate pads 35, and corresponding lower pads 15, which are electrically connected by the bent wires 50. In another embodiment, the metal pillars 70 may be selectively disposed on the lower pads 15 of the lower semiconductor die 10.

Referring to FIG. 7B, the semiconductor die stack 109 may include upper pads 25a which are not connected to the bent wires 50, as compared to the semiconductor die stack 108 illustrated in FIG. 7A. That is, the upper pads 25a on which metal pillars 70 are disposed may be isolated. The upper pads 25b on which metal pillars 70 are not disposed may be connected to the bent wires 50. A process of disposing the metal pillars 70 on the upper pads 25a may be facilitated.

Referring to FIG. 7C, the semiconductor die stack 110 may selectively include lower pads 16, upper pads 26, and intermediate pads 36 on which metal pillars 70, bent wires 50, or vertical wires 60 are not disposed as compared to the semiconductor die stacks 108 and 109 illustrated in FIGS. 7A and 7B.

Figure 8A:
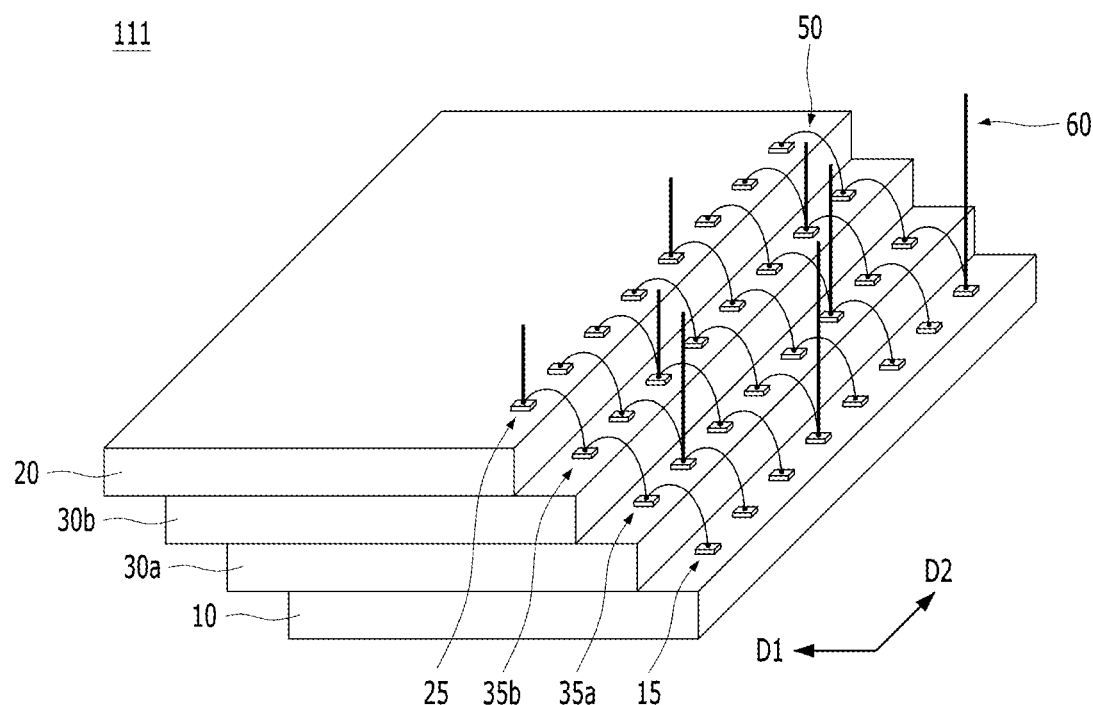
FIGS. 8A and 8B are perspective views illustrating semiconductor die stacks according to embodiments of the present disclosure.
Figure 8B:
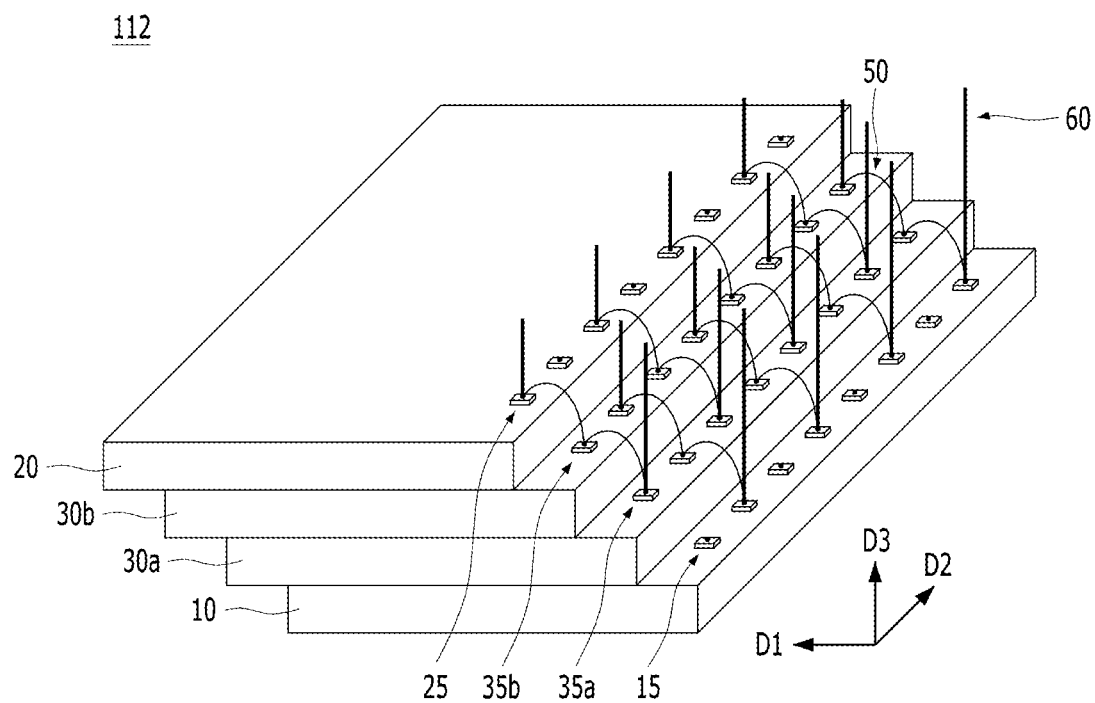

FIGS. 8A and 8B are perspective views illustrating semiconductor die stacks 111 and 112 according to embodiments of the present disclosure. Referring to FIG. 8A, the semiconductor die stack 111 may include a lower semiconductor die 10, a lower intermediate semiconductor die 30a, an upper intermediate semiconductor die 30b, an upper semiconductor die 20, bent wires 50, and vertical wires 60. The lower die 10, the lower intermediate die 30a, the upper intermediate die 30b, and the upper semiconductor die 20 may be stacked in a staircase form in the first direction D1. Each of the bent wires 50 may electrically connect each of the lower pads 15, the lower intermediate pads 35a, the upper intermediate pads 35b, and the upper pads 25 which are arranged in the first direction D1. The lower pads 15, the lower intermediate pads 35a, the upper intermediate pads 35b, and the upper pads 25 may be disposed on the lower die 10, the lower intermediate die 30a, the upper intermediate die 30b, and the upper semiconductor die 20, respectively, in a cascade form.

In another embodiment, some of the bent wires 50 may be selectively omitted according to the technical features described with reference to FIG. 2B. For example, some of the pads 15, 25, 35a, and 35b adjacent in the first direction D1 might not be electrically connected. That is, only some of the pads 15, 25, 35a, and 35b aligned in the first direction D1 may be electrically connected. Alternatively, all the pads 15, 25, 35a, and 35b aligned in the first direction D1 might not be electrically connected. The vertical wires 60 may be selectively disposed on any one of the pads 15, 25, 35a, and 35b which are electrically connected by the bent wires 50. The vertical wires 60 may be arranged in a diagonal direction not to be disposed on the pads 15, 25, 35a, and 35b which are adjacent to each other in the second direction D2.

In another embodiment, the vertical wires 60 may be selectively disposed on any one of the lower or upper pads 15 and 25 among the lower, lower intermediate, upper intermediate, and upper pads 15, 35a, 35b, and 25 which are electrically connected according to the technical features described with reference to FIG. 5B. For example, a vertical wire 60 might not be disposed on the lower intermediate pad 35a of the lower intermediate semiconductor die 30a and a corresponding upper intermediate pad 35b of the upper intermediate semiconductor die 30b.

In another embodiment, the vertical wires 60 may be selectively disposed on any one of corresponding lower pads 15, corresponding lower intermediate pads 35a, or corresponding upper pads 25 among the lower pads 15, lower intermediate pads 35a, upper intermediate pads 35b, and upper pads 25 which are electrically connected. For example, the vertical wires 60 might not be disposed on the upper intermediate pads 35b of the upper intermediate semiconductor die 30b.

In another embodiment, the vertical wires 60 may be selectively disposed on any one of a lower pad 15, corresponding upper intermediate pad 35b, or corresponding upper pad 25 among the lower pads 15, lower intermediate pads 35a, upper intermediate pads 35b, and upper pads 25 which are electrically connected. For example, the vertical wires 60 might not be disposed on the lower intermediate pads 35a of the lower intermediate semiconductor die 30a.

In another embodiment, some of the vertical wires 60 may be replaced with metal pillars 70. For example, referring to FIG. 3A, the vertical wires 60 on the upper pads 25 of the upper semiconductor die 20 may be replaced with the metal pillars 70.

Referring to FIG. 8B, the semiconductor die stack 112 may include a lower semiconductor die 10, a lower intermediate semiconductor die 30a, and an upper intermediate semiconductor die 30b, an upper semiconductor die 20, bent wires 50, and vertical wires 60. The lower die 10, the lower intermediate die 30a, the upper intermediate die 30b, and the upper semiconductor die 20 may be stacked in a staircase form in the first direction D1. The vertical wires 60 may be selectively disposed on two of the pads 15, 25, 35a, 35b electrically connected by the bent wires 50. The vertical wires 60 may be arranged in a diagonal direction, as shown in FIG. 8B. The vertical wires 60 may be arranged in a zigzag shape or pattern.

Figure 9A:
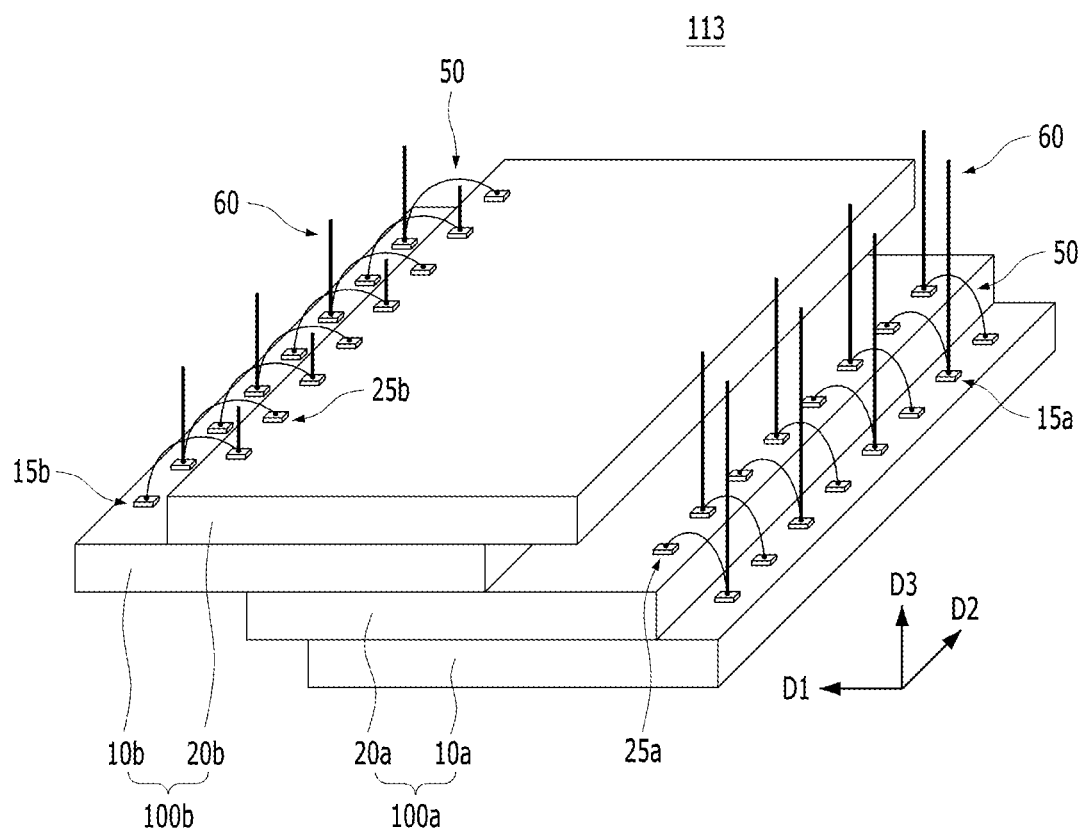
FIG. 9A is a perspective view illustrating a semiconductor die stack according to an embodiment of the present disclosure.

FIG. 9A is a perspective view illustrating a semiconductor die stack 113 according to an embodiment of the present disclosure. Referring to FIG. 9A, the semiconductor die stack 113 may include a lower semiconductor die stack 100a and an upper semiconductor die stack 100b which is stacked offset to the lower semiconductor die stack 100a in the first direction D1. The lower semiconductor die stack 100a may include a lower semiconductor die 10a and an upper semiconductor die 20a which are stacked in a staircase form in the first direction D1. The upper semiconductor die stack 100b may include a lower semiconductor die 10b and an upper semiconductor die 20b which are stacked in a staircase form in a direction opposite to the first direction D1.

The lower semiconductor dies 10a and 10b may include lower pads 15a and 15b on surfaces, respectively. The upper semiconductor dies 20a and 20b may include upper pads 25a and 25b on surfaces, respectively.

The bent wires 50 may connect the lower pads 15a of the lower semiconductor die 10a of the lower semiconductor die stack 100a with the upper pads 25a of the upper semiconductor die 20a of the lower semiconductor die stack 100a in a cascade form, or the bent wires 50 may connect the lower pads 15b of the lower semiconductor die 10b of the upper semiconductor die stack 100b and the upper pads 25b of the upper semiconductor die 20b of the upper semiconductor die stack 100b in a cascade form.

The vertical wires 60 may be selectively disposed on one of the lower pads 15a and 15b and the upper pads 25a and 25b which are electrically connected by the bent wires 50.

Figure 9B:
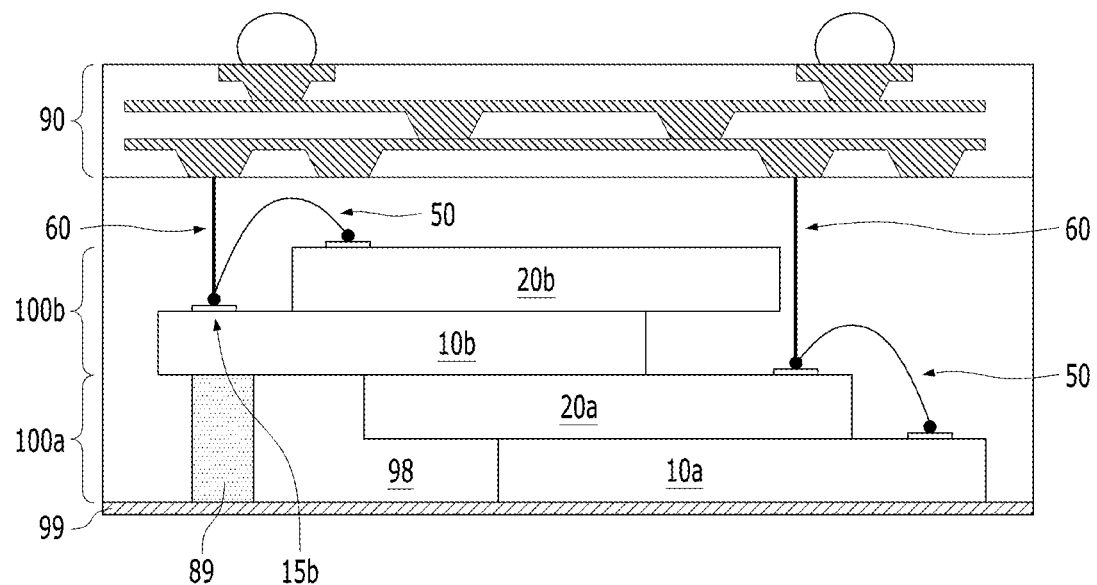
FIG. 9B is a side view illustrating a semiconductor package including a semiconductor die stack according to an embodiment of the present disclosure.

FIG. 9B is a side view illustrating a semiconductor package 203 including the semiconductor die stack 113 according to an embodiment of the present disclosure. Referring to FIG. 9B, the semiconductor package 203 may include the semiconductor die stack 113 illustrated in FIG. 9A and the redistribution layer 90. The semiconductor package 203 may further include a molding material 98 surrounding the semiconductor die stack 113 and a support substrate 99 supporting the semiconductor die stack 109. The semiconductor package 203 may further include a support structure 89 disposed between the exposed lower surface of the lower semiconductor die 10b of the upper semiconductor die stack 100b and the support substrate 99. The support structure 89 may be vertically aligned with the lower pad 15b of the lower semiconductor die 10b of the upper semiconductor die stack 100b. The support structure 89 may include a metal, plastic, ceramic, silicon pillar, a portion of a wafer, such as a dummy semiconductor die, or other structures capable of supporting the lower semiconductor die 10b. The support structure 89 may support the lower and upper semiconductor dies 10b and 20b of the upper semiconductor die stack 100b during the process of forming the bent wires 50 and the vertical wires 60 on the lower and upper semiconductor dies 10b and 20b of the upper semiconductor die stack 100b.

Although not specifically described, it will be understood that the technical features described with reference to the present specification and the accompanying drawings may be combined in various ways.

Although the technical features of the present disclosure have been shown and described with reference to specific embodiments thereof, it should be noted that the present disclosure is not limited to the embodiments described herein. Also, it will be appreciated by one of ordinary skill in the art that various changes and modifications may be made thereto without departing from the scope of the disclosure.

What is claimed is:
1. A semiconductor package, comprising:
 a lower semiconductor die and an upper semiconductor die which are stacked in a staircase form in a first direction, wherein
  the lower semiconductor die includes a plurality of lower pads arranged in a second direction, which is perpendicular to the first direction, and
  the upper semiconductor die includes a plurality of upper pads arranged in the second direction;
 bent wires electrically connecting at least one of the lower pads of the lower semiconductor die to at least one of upper pads of the upper semiconductor die in pairs in the first direction; and
 vertical wires disposed on any ones of the lower pads and the upper pads which are electrically connected by the bent wires, wherein a distance between the vertical wires of adjacent pairs of pads is greater than a pitch between the upper pads of adjacent pairs of pads.

2. The semiconductor package of claim 1, wherein the vertical wires are disposed in a zig-zag pattern in the second direction.

3. The semiconductor package of claim 1, wherein the vertical wires are disposed in a diagonal direction with respect to the first and second directions.

4. The semiconductor package of claim 1, wherein a distance between the vertical wires of adjacent pairs of pads is greater than a pitch between the upper pad and the lower pad of the pair of pads along the first direction.

5. The semiconductor package of claim 1, wherein:
at least one vertical wire is disposed on at least one upper pad of the plurality of upper pads; and
at least one vertical wire is disposed on at least one lower pad of the plurality of lower pads.

6. The semiconductor package of claim 1, further including metal pillars disposed on upper pads among the lower and upper pads which are electrically connected by the bent wires.

7. The semiconductor package of claim 6, wherein pairs of pads with vertical wires on the lower pad and pairs of pads with metal pillars on the upper pads are alternately arranged in the second direction.

8. The semiconductor package of claim 1, wherein some of the lower and upper pads which are arranged in the first direction are not connected by bent wires.

9. The semiconductor package of claim 8, wherein vertical wires are disposed on the lower and upper pads which are not connected by bent wires.

10. The semiconductor package of claim 1, further including an intermediate semiconductor die between the lower and upper semiconductor dies, wherein:
the intermediate semiconductor die includes intermediate pads;
the intermediate pads are arranged in the first direction along with the lower and upper pads; and
the lower pads, the intermediate pads, and the upper pads which are arranged in the first direction are electrically connected by the bent wires in a cascade form.

11. The semiconductor package of claim 10, wherein the vertical wires are disposed on any one of the lower pad, the intermediate pad, and the upper pad which are electrically connected by the bent wires.

12. The semiconductor package of claim 10, wherein the vertical wires are disposed on any one of the lower pad and the upper pad without being disposed on the intermediate pad which are electrically connected by the bent wires.

13. The semiconductor package of claim 1, further including a redistribution layer, wherein:
the redistribution layer includes a lower via, a lower interconnection layer, an upper via, and an upper interconnection layer; and
the lower via is electrically connected to at least one of the vertical wires, and the upper via electrically connects the lower interconnection layer with the upper interconnection layer.

14. A semiconductor package comprising a semiconductor die stack, the semiconductor die stack including:
a lower semiconductor die including first and second lower pads, and an upper semiconductor die including first and second upper pads stacked on the lower semiconductor die;
a first bent wire electrically connecting the first lower pad with the first upper pad in a first direction;
a second bent wire electrically connecting the second lower pad with the second upper pad in the first direction;
a first vertical wire disposed on any one of the first lower pad and the first upper pad; and
a second vertical wire disposed on any one of the second lower pad and the second upper pad,
wherein the first lower pad and the first upper pad are aligned in the first direction;
wherein the second lower pad and the second upper pad are aligned in the first direction;
wherein the first lower pad and the second lower pad are aligned in a second direction, the second direction being perpendicular to the first direction;
wherein the first upper pad and the second upper pad are aligned in the second direction; and
wherein the first vertical wire and the second vertical wire are arranged in a diagonal direction with respect to the first and second directions.

15. The semiconductor package of claim 14, wherein:
the first lower pad and the first upper pad are spaced apart by a first pitch in the first direction; and
a distance between the first vertical wire and the second vertical wire is greater than the first pitch.

16. The semiconductor package of claim 15, wherein:
the first lower pad and the second lower pad are spaced apart by a second pitch in a second direction, the second direction being perpendicular to the first direction; and
a distance between the first vertical wire and the second vertical wire is greater than the second pitch.

17. A semiconductor package comprising a semiconductor die stack, the semiconductor die stack including:
a lower semiconductor die and an upper semiconductor die which are stacked in a staircase form in a first direction; and
metal pillars,
wherein the lower semiconductor die includes a plurality of lower pads arranged in a second direction, the second direction being perpendicular to the first direction, and
wherein the upper semiconductor die includes a plurality of upper pads arranged in the second direction;
wherein bent wires electrically connect at least one of the lower pads of the lower semiconductor die to at least one of the upper pads of the upper semiconductor die in the first direction; and
wherein vertical wires disposed on one of the lower pads for at least every other pair of pads which are electrically connected by the bent wires in the first direction,
wherein the metal pillars are disposed on the lower pad for at least every other pair of pads which are electrically connected by the bent wire,
wherein the metal pillars and the vertical wires are alternately disposed on pairs of pads in the second direction.

* * * * *